United States Patent [19]
Baker

[11] Patent Number: 6,006,616
[45] Date of Patent: Dec. 28, 1999

[54] SEMICONDUCTOR TESTER WITH POWER ASSIST FOR VERTICAL TEST HEAD MOVEMENT

[75] Inventor: David A. Baker, Hillsboro, Oreg.

[73] Assignee: Credence Systems Corporation, Fremont, Calif.

[21] Appl. No.: 08/891,482

[22] Filed: Jul. 11, 1997

[51] Int. Cl.$^6$ .................................................. G01D 21/00
[52] U.S. Cl. ............................................................ 73/866.5
[58] Field of Search ..................... 73/866.5; 324/754–769

[56] References Cited

U.S. PATENT DOCUMENTS 5,450,766  9/1995  Holt ......................................... 73/866.5
5,821,440  10/1998  Khater et al. ........................... 73/866.5

Primary Examiner—Robert Raevis
Attorney, Agent, or Firm—Smith-Hill and Bedell

[57] ABSTRACT

A semiconductor tester includes a support frame and a test head assembly mounted to the support frame for vertical movement relative thereto. A counterbalance assembly also is mounted to the support frame for vertical movement relative thereto. A force transmission member interconnects the test head assembly and the counterbalance assembly, whereby upward movement of the test head assembly is accompanied by downward movement of the counterbalance assembly and downward movement of the test head assembly is accompanied by upward movement of the counterbalance assembly. A force sensing transducer which is coupled to the test head assembly develops an output signal dependent on an external effort applied to the test head assembly to cause vertical movement thereof in a selected direction. A force amplifier is responsive to the output signal of the force sensing transducer and has an output member coupled drivingly to at least one of the assemblies for applying a force thereto dependent on and assisting the external effort applied to the test head.

6 Claims, 3 Drawing Sheets

SEMICONDUCTOR TESTER WITH POWER ASSIST FOR VERTICAL TEST HEAD MOVEMENT

CROSS-REFERENCE TO RELATED APPLICATIONS

Certain subject matter disclosed in this application is also disclosed in patent applications 08/846,350, now U.S. Pat. No. 5,821,440, and 08/846,691, both filed Apr. 30, 1997, the disclosure of each of which is hereby incorporated by reference herein.

BACKGROUND OF THE INVENTION

This invention relates to a semiconductor tester with power assist for vertical test head movement.

A known type of semiconductor tester includes a test head having an array of terminals exposed at an interface surface of the test head for engaging corresponding terminals of a load board on which a semiconductor device under test (DUT) is mounted in order to effect electrical connection between the terminals of the test head and corresponding pins of the DUT.

The tester is used in conjunction with an interfacing mechanism, such as a wafer prober or an integrated circuit device handler, for delivering semiconductor devices in succession to a test location at which an individual DUT is mounted to the load board and a test is performed. There are numerous makes and models of such interfacing mechanisms and different interfacing mechanisms have different requirements for the orientation of the DUT in the test location. A given tester should be useable with a variety of these interfacing mechanisms and it may be necessary from time to time to change the location and/or orientation of the test head. For this purpose, the test head is attached to a support frame by a manipulator which guides movement of the test head along a vertical axis and two mutually perpendicular horizontal axes, and may also permit rotational movement of the test head.

When the tester is to be used with a different interfacing mechanism, the operator must carefully position the test head at the proper location and in the proper orientation to engage the load board. It is necessary to avoid collision when the test head is moved or re-oriented since this may cause damage to the test head or other equipment.

The moving mass of the test head and manipulator mechanism may be quite substantial. It is known to use a counterbalance mechanism to support the weight of a massive object that is to be moved vertically, but even if the weight of the counterbalance is equal to the weight of the object to be moved, substantial forces may still be necessary to bring about movement of the object since it is necessary to overcome the inertia of rest and frictional resistance.

It is conventional to use a power operated mechanism to move a massive object. For example, in a gantry crane, electric or hydraulic motors are used to drive a lifting device along two mutually perpendicular horizontal axes. Such power operated mechanisms generally include a three position switch (e.g. forward, stop, reverse) for each axis, and the operator positions the switch at forward for movement in one direction along a selected axis, reverse for movement in the other direction along the selected axis, and stop for no movement along that axis. This type of mechanism is subject to disadvantage because the operator must control the switches by observation of the position of the lifting device, and if the operator misjudges the position of the lifting device, there is a danger of collision. Further, these mechanisms do not allow the operator to adjust the speed of movement of the lifting device along a selected axis.

SUMMARY OF THE INVENTION

According to the present invention there is provided a semiconductor tester including a support frame, a test head assembly mounted to the support frame for vertical movement relative thereto, a counterbalance assembly mounted to the support frame for vertical movement relative thereto, a force transmission member interconnecting the test head assembly and the counterbalance assembly, whereby upward movement of the test head assembly is accompanied by downward movement of the counterbalance assembly and downward movement of the test head assembly is accompanied by upward movement of the counterbalance assembly, a force sensing transducer coupled to the test head assembly and developing an output signal dependent on an external effort applied to the test head assembly to cause vertical movement thereof in a selected direction, and a force amplifier responsive to the output signal of the force sensing transducer and having an output member coupled drivingly to at least one of said assemblies for applying a force thereto dependent on and assisting said external effort.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
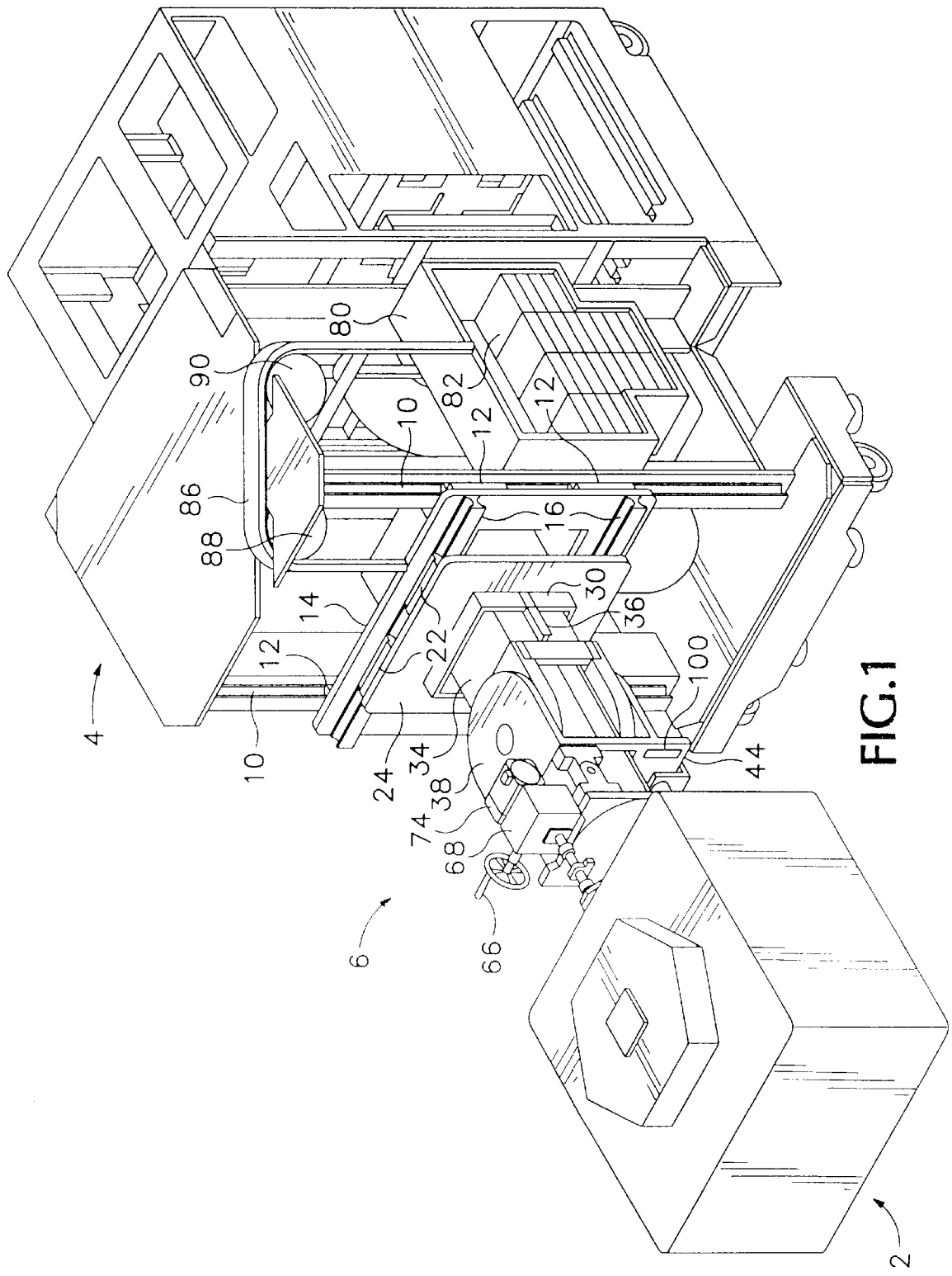
FIG. 1 is a perspective view of a semiconductor tester in accordance with the present invention.
Figure 2:
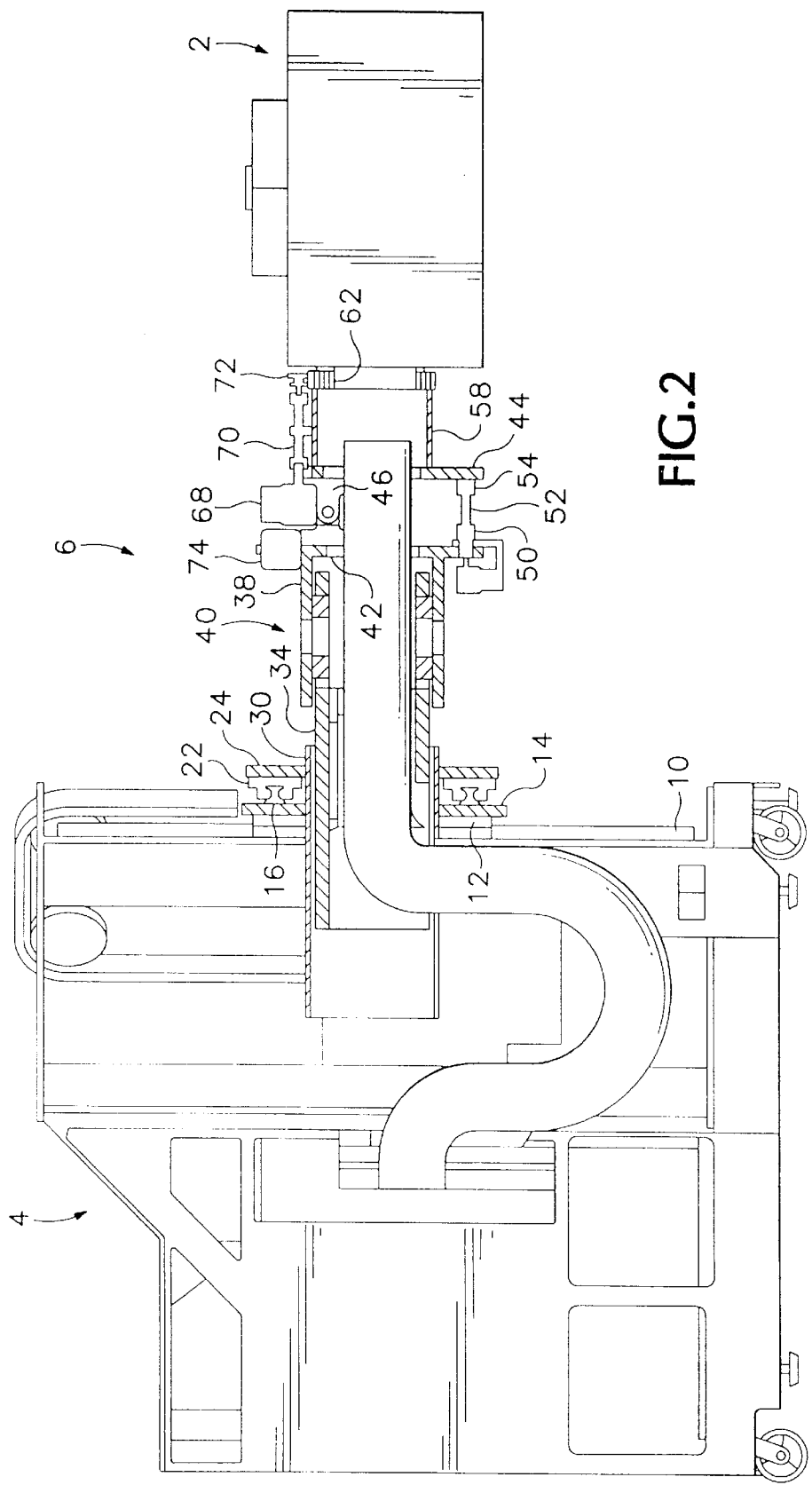
FIG. 2 is a side elevation of the semiconductor tester.

The illustrated semiconductor tester includes a test head 2 which is mounted to a frame 4 by a manipulator 6. The manipulator 6 includes vertical rails 10 which are rigidly attached to the frame 4. Vertical bearings 12 are rigidly attached to a vertical rail plate 14 and engage the vertical rails 10 respectively, and accordingly the vertical rail plate 14 is able to move vertically with respect to the frame 4. Horizontal rails 16 are rigidly attached to the vertical rail plate 14. Horizontal bearings 22 are rigidly attached to a horizontal rail plate 24 and engage the horizontal rails 16 respectively, and accordingly the horizontal rail plate 24 is able to move horizontally with respect to the vertical rail plate 14. A horizontal box flange 30 projects from the horizontal rail plate 24 and an inner extension arm 34 which extends through the horizontal box flange 30 is provided with rails 36 which engage bearings (not shown) secured to the interior of the horizontal box flange 30. The inner extension arm 34 is attached at its projecting end to an outer swing arm 38 by a pivot mechanism 40 which allows angular movement of the outer swing arm 38 relative to the inner extension arm 34 about a vertical axis. The outer swing arm 38 includes an inboard tumble axis plate 42 which is connected to an outboard tumble axis plate 44 by a hinge mechanism 46 allowing limited pivotal movement of the plate 44 about a horizontal tumble axis near the top of the plate 44. A ball nut 50 attached to the plate 42 near its bottom is threaded by a screw 52 which engages a thrust pad 54 on the plate 44. A handwheel (not shown) is connected to the screw 52 through a reduction gear for driving the screw 52 to force the lower end of the plate 44 away from the plate 42 or to permit the lower end of the plate 44 to approach the plate 42.

A mounting tube 58 is attached to and projects horizontally from the plate 44. The test head 2 includes a hub 62 which is journalled in the tube 58 by ring bearings. A handwheel 66 is coupled through a gear box 68 and a shaft 70 to a sprocket 72, which engages the test head to effect rotation of the test head about the central axis of the mounting tube 58. By activation of a switch (not shown) a drive motor 74 which is coupled to the shaft 70 can be energized to provide power driven rotation of the test head 2 about the central axis of the tube 58.

The test head 2 and manipulator 6 have a mass of several hundred pounds. The vertical rail plate 14 is connected to a counterbalance tray 80, containing counterbalance weight elements 82 to offset the weight of the test head and manipulator, by a chain 86 which extends vertically upward from the plate 14, over two horizontally spaced sprocket wheels 88 and 90 which are journalled to the frame 4 for rotation about respective parallel horizontal axes, and vertically downward to the counterbalance tray. The mass of the counterbalance tray and counterbalance weight elements is substantially equal to the mass of the manipulator and test head, and accordingly the test head can be moved vertically using a force sufficient to overcome the inertia of rest of the masses that are moved and the dynamic frictional resistance to motion.

The test head is provided with handles (not shown) which can be gripped by the operator in order to move the test head along the three axes of linear movement or to swing the test head about the vertical axis of pivotal movement.

Because of the large mass of the counterbalance tray and its contents and the manipulator and test head, the force required to overcome the inertia of rest of the movable masses is quite large. Accordingly, an operator may experience difficulty in moving the test head vertically, either up or down.

Figure 3:
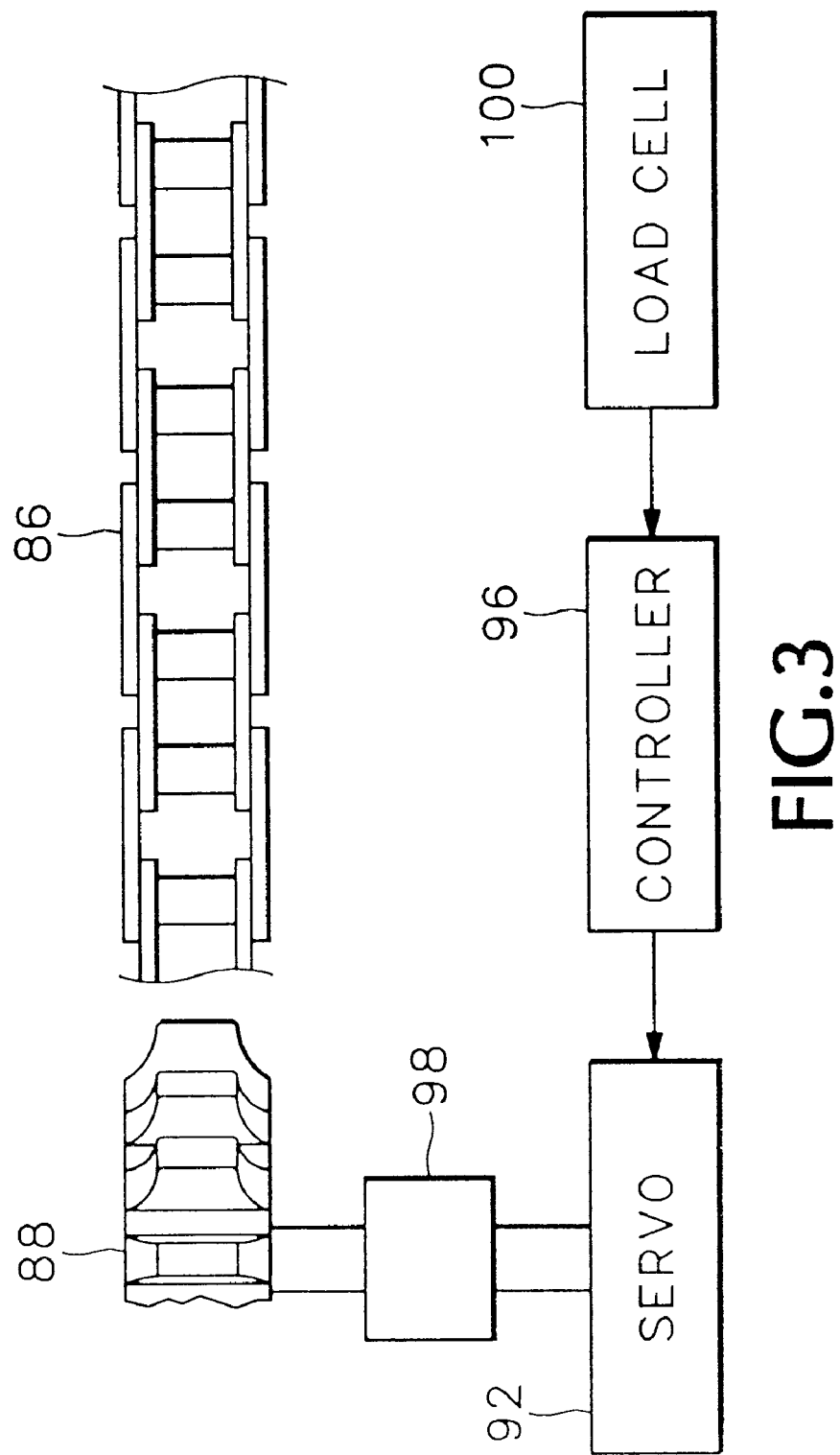
FIG. 3 is a schematic block diagram illustrating part of the semiconductor tester.

Referring to FIG. 3, a servo 92 is mounted in the frame 4 and a controller 96 supplies a control signal to the servo. The servo has an output shaft which is coupled through a flexible linkage 98 to the shaft on which the sprocket wheel 88 is mounted. The flexible linkage 98 allows a small degree of misalignment of the output shaft of the servo relative to the shaft of the sprocket wheel 88. The servo 92 applies a torque to the sprocket wheel 88, the magnitude and direction of the torque being dependent on the control signal supplied by the controller 96.

It is very important that the movement of the test head be carefully controlled and that collision be avoided. For example, when the test head is in the orientation shown in FIG. 1, upward vertical movement of the test head brings about engagement with the load board, and if the test head moved upward without careful control, there could be a collision with the load board causing damage to the load board and/or to the test head itself.

It would in principle be possible to incorporate a force sensing transducer between each of the handles and the test head so that when the operator applies a force to a handle, the transducer provides a signal representative of the force to the controller 96, and the controller generates a servo control signal dependent on the signal provided by the transducer. However, this solution is subject to disadvantage since it also necessitates a mechanism for detecting the orientation of the test head in order to determine the direction of the force applied by the operator. Added complication arises because rotating the test head about the axis of the tube 58 allows the test head to be oriented not only with the interface surface horizontal, such that the test head engages the DUT by vertical relative movement (up or down), but also with the interface surface vertical, such that the test head engages the DUT by horizontal relative movement.

Since the tube 58 is attached to the outboard tumble axis plate 44 above the thrust pad 54, the weight of the test head always applies a force to the plate 44 between the horizontal tumble axis and the thrust pad 54, tending to deflect the plate 44, regardless of the orientation of the test head. When an operator applies an effort tending to move the test head upward, the deflection of the plate is reduced, whereas when the operator applies an effort tending to move the test head downward, the deflection is increased.

A load cell 100 is mounted on the plate 44 to detect deflection of the plate 44. The load cell generates an analog signal having a voltage level proportional to the vertical force applied to the plate 44 through the mounting tube 58. The signal provided by the load cell 100 is independent of the orientation of the test head. The analog load cell signal is supplied to the controller 96, which generates a servo control signal dependent on the magnitude and direction of the vertical force applied to the test head by the operator. The servo applies a torque to the sprocket wheel dependent on the control signal.

The force provided by the servo acts on either the manipulator or the counterbalance tray through tension in the chain and tends to raise one movable mass while allowing the other movable mass to move downward. Thus, in the event that the operator wishes to raise the test head, the torque applied to the sprocket wheel by the servo generates additional tension in the upward run of the chain and tends to pull the manipulator upward. The counterbalance tray moves downward under the force of gravity, its downward motion being resisted by tension in the downward run of chain. In the event that the operator wishes to lower the test head, the torque generated in the chain by the servo increases the tension in the downward run of the chain and the tension is then sufficient to lift the counterbalance tray, whereas the manipulator and the test head attached thereto move downward under the force of gravity, resisted by the tension in the upward run of the chain.

The load cell 100, the controller 96 and the servo 92 function together as a force amplifier, applying a force to the vertically movable masses acting in the same direction as the operator's effort and sufficient to overcome the inertia of rest of the vertically movable masses without undue strain on the operator.

The gain function relating the force applied to the chain by the servo to the force applied to the test head by the operator may be linear, but this is not necessary. For example, it may be advantageous that the gain should increase as the force applied by the operator increases. Further, the controller may be programmed so that as the force decreases, the gain goes to zero at a finite force level. In this case the test head will not be moved with power assistance unless the force applied by the operator exceeds a threshold value. The gain may also be time dependent: the controller may be programmed so that it does not respond instantly to a force applied to the test head, in order to protect against movement of the test head due to an inadvertent touching of the handles. The gain may be dependent on position of the test head: the controller may be programmed to reduce the gain to zero when the test head is about to engage the load board, in order to ensure that final interfacing motion is under operator control only. The controller may be programmed to turn off if a predetermined time elapses without force being applied to the test head, such that the system must be reset by actuating a switch before the power assist mechanism will operate again. This is for safety of the operator and to prevent the test head colliding with other structures. The switch for enabling the power assist mechanism may be illuminated to warn the operator and others that the power assist mechanism is on. When the power assist mechanism is off, it does not add significantly to the inertia that must be overcome by the operator in order to move the test head up or down because the servo is free running.

It will be appreciated that the invention is not restricted to the particular embodiment that has been described, and that variations may be made therein without departing from the scope of the invention as defined in the appended claims and equivalents thereof. For example, although the invention has been described with reference use of a servo for driving the sprocket wheel, it would also be possible to use another form of prime mover, such as an electric motor of suitable size. This may be advantageous in order to reduce electric power requirements. In order to generate sufficient torque with an electric motor, it may be necessary to connect reduction gearing between the motor and the sprocket wheel. In this case, it would be desirable to provide an electrically operated clutch between the reduction gearing and the shaft of the sprocket wheel, the clutch being disengaged when the power assist mechanism is off so that the motor and gearing will not contribute to the inertia that must be overcome by the operator in order to raise or lower the test head.

I claim:

1. A semiconductor tester including:
    a support frame,
    a test head assembly mounted to the support frame for vertical movement relative thereto,
    a counterbalance assembly mounted to the support frame for vertical movement relative thereto,
    a force transmission member interconnecting the test head assembly and the counterbalance assembly, whereby upward movement of the test head assembly is accompanied by downward movement of the counterbalance assembly and downward movement of the test head assembly is accompanied by upward movement of the counterbalance assembly,
    a force sensing transducer coupled to the test head assembly and developing an output signal dependent on an external effort applied to the test head assembly to cause vertical movement thereof in a selected direction, and
    a force amplifier responsive to the output signal of the force sensing transducer and having an output member coupled drivingly to at least one of said assemblies for applying a force thereto dependent on and assisting said external effort.

2. A semiconductor tester according to claim 1, wherein the test head assembly comprises a manipulator mounted to the support frame for vertical movement relative thereto and a test head attached to the manipulator for vertical movement therewith, the manipulator including a plate which is deflected under the weight of the test head, and wherein the force sensing transducer comprises a load cell detecting deflection of the plate and developing an output signal dependent on deflection of the plate.

3. A semiconductor tester according to claim 2, wherein the force amplifier comprises a controller responsive to the transducer signal and generating a drive signal dependent thereon and a prime mover having an output shaft coupled drivingly to at least one of said assemblies and responsive to the drive signal to apply a force dependent thereon to said output shaft.

4. A semiconductor tester according to claim 3, wherein the force transmission member comprises a chain having one end connected to the test head assembly and an opposite end connected to the counterbalance assembly and at least one sprocket wheel journalled in the support frame and over which the chain is trained in a first segment extending between the test head assembly and the sprocket wheel and a second segment extending between the counterbalance assembly and the sprocket wheel, and the output shaft of the prime mover is coupled drivingly to said sprocket wheel.

5. A semiconductor tester according to claim 1, wherein the force transmission member comprises a flexible tension member having one end connected to the test head assembly and an opposite end connected to the counterbalance assembly and at least one wheel journalled in the support frame and over which the tension member is trained in a first segment extending between the test head assembly and the wheel and a second segment extending between the counterbalance assembly and the wheel.

6. A semiconductor tester according to claim 5, wherein the flexible tension member is a chain, the wheel is a sprocket wheel in driving engagement with the chain, and the output member of the force amplifier is a rotary shaft coupled drivingly to said sprocket wheel.

* * * * *